(12) United States Patent
Bayer et al.

(10) Patent No.: US 6,692,986 B1
(45) Date of Patent: Feb. 17, 2004

(54) METHOD FOR ENCAPSULATING COMPONENTS

(75) Inventors: Heiner Bayer, Olching (DE); Wolfgang Rogler, Moehrendorf (DE); Wolfgang Roth, Uttenreuth (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/070,608

(22) PCT Filed: Sep. 6, 2000

(86) PCT No.: PCT/DE00/03084
§ 371 (c)(1),
(2), (4) Date: Jun. 25, 2002

(87) PCT Pub. No.: WO01/18887
PCT Pub. Date: Mar. 15, 2001

(30) Foreign Application Priority Data

Sep. 9, 1999 (DE) .......................................... 199 43 149

(51) Int. Cl.$^7$ ............................................... H01L 51/20
(52) U.S. Cl. ........................... 438/99; 438/64; 438/116
(58) Field of Search ............................... 438/64, 99, 116

(56) References Cited

U.S. PATENT DOCUMENTS

| 4,593,052 | A | * | 6/1986 | Irving ........................... 522/31 |
| 5,242,715 | A | | 9/1993 | Schoen et al. ............... 427/386 |
| 5,447,797 | A | * | 9/1995 | Stapp et al. ................. 428/413 |
| 5,703,394 | A | | 12/1997 | Wei et al. ....................... 438/5 |
| 5,747,363 | A | | 5/1998 | Wei et al. ..................... 257/433 |
| 5,895,228 | A | | 4/1999 | Biebuyck et al. .............. 438/99 |
| 5,900,286 | A | * | 5/1999 | Bayer et al. ................. 427/510 |
| 6,150,435 | A | * | 11/2000 | Bayer et al. ................. 523/434 |
| 6,200,408 | B1 | * | 3/2001 | Bayer et al. ............. 156/273.3 |
| 6,491,845 | B1 | * | 12/2002 | Schile ................... 252/182.24 |

FOREIGN PATENT DOCUMENTS

| DE | 0 504 569 A3 | | 9/1992 |
| DE | 0 504 569 A2 | | 9/1992 |
| DE | 196 03 746 A1 | * | 4/1997 |
| DE | 198 45 075 A1 | * | 4/2000 |
| EP | 0 468 440 A2 | * | 1/1992 |
| EP | 0 430 273 B1 | | 1/1998 |
| EP | 0 781 075 B1 | | 12/2001 |
| WO | 97/46052 | * | 12/1997 |

OTHER PUBLICATIONS

Burrows et al., Reliability and degradation of organic light emitting devices, *Appl. Phys. Lett.*, 65 (Dec. 1994) 2922.*

* cited by examiner

*Primary Examiner*—Richard Elms
(74) *Attorney, Agent, or Firm*—Harness, Dickey & Pierce, P.L.C.

(57) ABSTRACT

A method of encapsulating components based on organic semiconductors, includes adhesively bonding a housing to a substrate. Bonding is carried out using a UV-curable reactive adhesive including an epoxy resin, a hydroxy-functional reaction product of an epoxide compound with a phenolic compound, a silane-type adhesion promoter, and a photoinitiator, and also if desired, filler. This method is used in particular for encapsulating organic light-emitting diodes (OLEDs).

17 Claims, No Drawings

METHOD FOR ENCAPSULATING COMPONENTS

This application is the national phase under 35 U.S.C. §371 of PCT International Application No. PCT/DE00/03084 which has an International filing date of Sep. 6, 2000, which designated the United States of America, the entire contents of which are hereby incorporated by reference.

FIELD OF THE INVENTION

The invention generally relates to a method of encapsulating components based on organic semiconductors. Preferably, it relates especially to organic light-emitting diodes, in which a housing is bonded adhesively to a substrate.

BACKGROUND OF THE INVENTION

Components whose functioning is based on the use of organic semiconductors must be given effective protection against ambient influences, and especially against degradation caused by air or moisture. This purpose is generally served by a housing, which may also, for example, be a flat cover.

Components based on organic semiconductors are, in particular, organic light-emitting diodes (OLEDs). Light-emitting diodes of this kind feature organic monomers or polymers arranged between electrodes, with one electrode being transparent. When a voltage is applied to the electrodes, light is emitted. For this purpose OLEDs typically feature an organic electroluminescent material (emitter), an organic hole transport material, and an organic electron transport material. These materials, and the cathode material too, require protection against degradation caused by air (oxygen) and water, for which efficient capsuling is needed.

The capsuling of OLEDs can take place in a variety of ways: for example, by means of glass solders, i.e., by joining (glass) parts using a glass solder (German patent application file ref. 198 45 075.3). Already known as well is an electroluminescent system wherein the electroluminescent element is enclosed in a housing composed of a substrate, which carries the electroluminescent element, and a cover layer, made of a low-melting metal or a corresponding alloy and provided with an electrically conducting adhesive film (WO 97/46052). A disadvantage here is that the relatively high temperatures needed for processing the glass solder and/or the metal or alloy from the melt may result in damage to the electroluminescent element.

An organic electroluminescent device with a flat cover is known from EP 0 468 440 B 1. Atop the cathode in this device is a protective layer composed of a mixture of at least one component of the organic electroluminescent medium and at least one metal having a work function in the range from 4 to 4.5 Ev. The protective layer is produced by coevaporation of the aforementioned materials, although this involves a great deal of complexity.

"Applied Physics Letters", Vol. 65 (1994), pages 2922 to 2924 discloses covering the OLED on a glass substrate with a glass plate and adhesively bonding said plate to the glass substrate; bonding can be carried out using a commercial epoxy adhesive. The use of an epoxide for sealing organic light-emitting devices is also known from the U.S. Pat. Nos. 5,703,394 and 5,747,363.

DE 196 03 746 A1 discloses an electroluminescent device (with light-emitting organic material) whose capsuling comprises a multilayer system. This multilayer system is composed of at least one layer of plastic, and a metallic layer. In addition, there may be what is called a getter layer, which is embedded between two plastic layers. The plastic layers may consist, inter alia, of an epoxy resin.

In investigations on organic light-emitting diodes—for example, in storage tests at a temperature of 85° C. and a relative humidity of 85%—it nevertheless proved impossible to find any commercially available adhesive which neither corroded the base metals used as cathode material nor impaired the light-emitting materials.

SUMMARY OF THE INVENTION

It is an object of an embodiment of the invention, therefore, to specify a method of encapsulating components based on organic semiconductors which on the one hand permits hermetic capsuling, so that harmful environmental effects are ruled out, and on the other hand does not lead to damage to the materials used in the components.

An object can be achieved in accordance with an embodiment of the invention by carrying out adhesive bonding using a UV-curable reactive adhesive comprising the following components:
  an epoxy resin,
  a hydroxy-functional reaction product of an epoxide compound with a phenolic compound,
  a silane-type adhesion promoter, and
  a photoinitiator, and also
  if desired, filler.

The stated technical problem can be solved in accordance with an embodiment of the invention by joining the given parts by using a specially formulated adhesive based on epoxy resin. The given parts comprise a housing and a substrate which is the location for the organic semiconductor and the other materials needed for the functioning of the component: for example, metals as conductor tracks. Glass substrates in particular can be used, although plastic film substrates or plastic/glass composites may also be used. The housing may be a plate, particularly a glass plate, and is preferably a cover, made in particular from glass, although it may also be of ceramic or metal.

The adhesive used in accordance with an embodiment of the invention for constructive adhesive sealing, which can be applied without great effort, can be advantageously liquid or low-melting and therefore wetting. It is therefore particularly suitable for capillary gluing, i.e., for filling thin joints, but may alternatively be used as a casting resin or coating material.

The use of the adhesive of an embodiment of the invention produces the following advantages, including:
  cost effective, automatable process;
  rapid process;
  low temperature process, thus no damage to the organic semiconductor;
  no cumbersome insulation of adjacent conductor tracks which pass through the adhesion zone, owing to the electrically insulating nature of the adhesive.
Special advantages of the adhesives include:
  one-component system, storable at room temperature for at least 1 year;
  no outgassing of volatile constituents damaging to the functioning of the component;
  high adhesion to glass over a wide temperature range;
  flexibility sufficient over a wide temperature range, thereby minimizing mechanical stress as a result of thermal loading;

optical transparency;

higher O₂ and H₂O diffusion barrier;

electrically insulating activity;

ability to be processed under inert conditions;

rapid curing by UV irradiation.

The specific formulation of the adhesive gives it, in particular, high compatibility with components and also an effective air and moisture barrier effect. Accordingly, this adhesive is outstandingly suitable for capsuling (encapsulating) components based on organic semiconductors, especially light-emitting diodes.

When using covers which are bonded only at the edges, rather than plates, it is possible to avoid flat bonding and, consequent thereon, additional mechanical stress on the component.

The adhesive can be applied in particular, by capillary gluing, thus producing an extremely small adhesive joint of from 1 to 30 μm, generally <10 μm. The result is a minimal area of attack for oxygen and water. As a result of the specific cationically initiated curing of the adhesive, i.e., the UV cure, "one" polymer molecule is obtained, so to speak, which is free of low molecular mass, outgassable constituents harmful to the performance of the diodes. Moreover, it is possible to apply the adhesive in an inert gas atmosphere, which is necessary for the handling of the air-sensitive metal electrode materials, such as calcium. As a consequence of the UV-curability, a rapid process with a one-component resin is made possible. Encapsulation may also take place in addition to flat inorganic protective layers that are present on the components; such protective layers include, for example, $SiO_2$ or $Si_3N_4$.

UV curing of the reactive adhesive may be followed advantageously by a thermal treatment, preferably up to a temperature of 120° C. The lower temperature limit is generally about 10 to 20° C. below the glass transition temperature of the cured adhesive. As a result of the thermal treatment (aftercure), the barrier effect of the adhesive film toward water and oxygen can be increased further.

The epoxy resin in the reactive adhesive may be an aliphatic, cycloaliphatic or aromatic epoxide, with preference being given to aliphatic and cycloaliphatic epoxides, i.e., ring-epoxidized, epoxides. The epoxy resin is composed advantageously of ≧70% by mass of an aliphatic and/or cycloaliphatic epoxide.

The aliphatic epoxide used can includes, in particular, epoxidized polybutadiene or epoxidized soybean oil; further cycloaliphatic epoxides are preferably diepoxides. Examples of such diepoxides include 3,4-epoxycyclohexylmethyl 3',4'-epoxycyclohexanecarboxylate (EEC) and bis(3,4-epoxycyclohexylmethyl)adipate. Further epoxides of this kind are, for example, compounds in which the aliphatic chain of the adipic acid derivative, composed of 4 methylene units, is replaced by a chain with from 5 to 15 methylene units.

The reactive adhesive can advantageously contain from 3 to 80% by mass of hydroxy-functional reaction product, which serves as adhesion-promoting component. Compounds of this kind, which are known per se (DE 197 51 738 A1), can be prepared by base-catalyzed reaction of an epoxide compound with a phenolic compound, the basic catalyst preferably being an onium hydroxide, such as tetramethylammonium hydroxide:

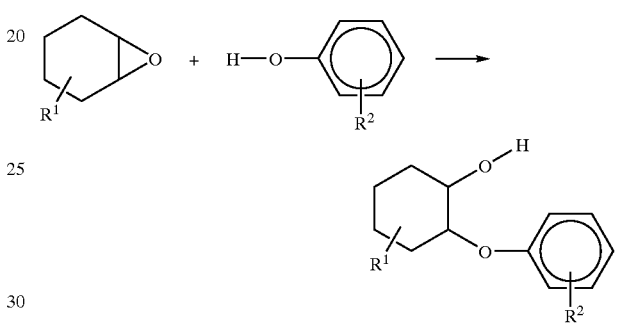

The radical $R^1$ here may be unreactive, as is the case, for example, with an alkyl or ester group, but may also be epoxy-functional. The radical $R^2$ may carry further phenolic groups, leading to the formation of reaction products of higher molecular mass; for each phenolic OH group, one aliphatic OH group is formed.

The hydroxy-functional reaction products, which advantageously possess a molar mass ≧500, may further contain epoxide groups, i.e., may also be epoxy-functional. This is the case when the radical $R^1$ carries an epoxide group. Compounds of this kind can be prepared by reacting bifunctional epoxides with bisphenols in a molar ratio of from 2:1 to 20:1; for example, by reacting bisphenol A with bis(3,4-epoxycyclohexylmethyl)adipate:

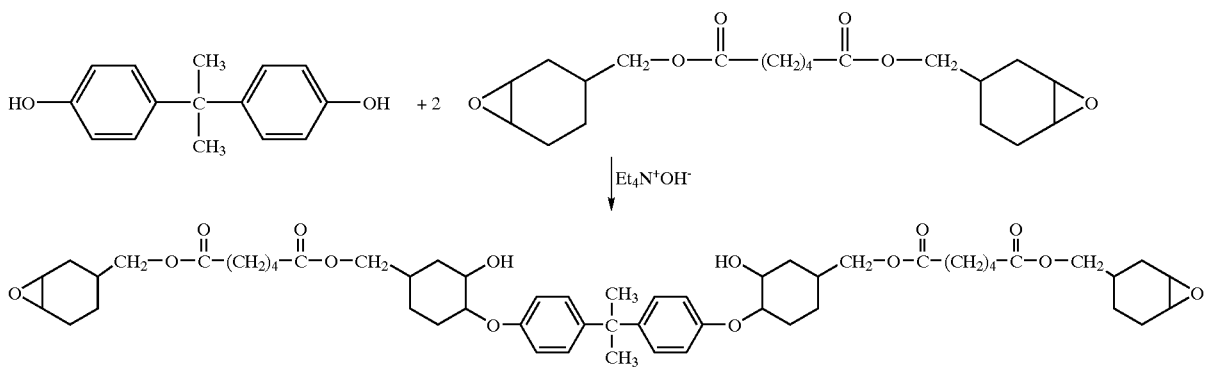

epoxides which can be used are, for example, dodecene oxide and diglycidyl esters of hexahydrophthalic acid. The The tetraethylammonium hydroxide catalyst used here—like other onium hydroxides as well—is thermolabile and after the end of the reaction breaks down into volatile and harmless products. The hydroxy-functional reaction products therefore contain no substances which might adversely affect the cationic curing of the reactive adhesive.

The silane-based adhesion promoters are, in particular, alkoxy-functional silanes, generally methoxy- and ethoxy-functional silanes. The silanes normally carry at least one further group attached by way of an Si—CC bond, as is the case, for example, with glycidyloxy-propyltrimethoxysilane. The adhesion promoter is added to the reactive adhesive in an amount of preferably from 0.05 to 2% by mass.

The photoinitiator is advantageously an onium salt, especially a triarylsulfonium salt with hexafluorophosphate, hexafluoroarsenate or hexafluoroantimonate as the anion, such as tri-phenylsulfonium hexafluoroantimonate. The reactive adhesive preferably has a photoinitiator content of from 0.01 to 5% by mass.

The reactive adhesive may also comprise filler. Suitable fillers include very finely ground minerals, particularly those based on silica, examples being quartz flours or fused silica flours, and finely dispersed silicas. These fillers are used in order to lower the thermal expansion coefficient of the adhesive. It may therefore be of importance for the adhesive to tolerate high fractions of filler while retaining good flow properties. Up to 70% by mass of filler may be contained within the reactive adhesive. The filler may also serve for reducing the moisture uptake or diffusion and for reducing shrinkage.

Besides the filler, further conventional additions or additives may be present, such as dyes, pigments, wetting auxiliaries, flow assistants, adhesion promoters, thixotropic agents, defoamers, flow modifiers, stabilizers, and flame retardants. By means of these substances it is possible to give the reactive adhesive additional properties, such as color, special rheological properties, and low flammability.

Advantageously, the reactive adhesive may further comprise a polyol; these are, in particular, polyesterpolyols and polyetherpolyols. Examples are polyestertriols based on trimethylolpropane and ε-caprolactam, and also polyesterdiols based on ethylene glycol. Polyetherpolyols are available in large numbers; chain extension here takes place, for example, with ethylene oxide or propylene oxide. Depending on their molar mass and OH content, the polyols, which serve to modify the mechanical properties of the cured adhesive, are used in an amount such that there is no excess of OH groups over epoxide groups.

The reactive adhesive may further comprise, in addition, a surface-active compound, in particular a surface-active siloxane; additives of this kind serve as defoamers and flow assistants. The fraction of the surface-active compound is low, generally just 0.1 to 0.5% by mass.

The invention is to be illustrated with reference to exemplary embodiments. The method of the invention for capsuling (encapsulating) components based on organic semiconductors is described with reference to organic light-emitting diodes, as an example.

DETAILED DESCRIPTION OF THE PREFERRED EMBODIMENTS

The diodes can be produced by known processes, such as by spin coating if using polymer solutions or by vacuum vapor deposition if using monomers. The substrates used are ITO-coated glasses (ITO=indium tin oxide), and the ITO may also have been structured; ITO serves as the anode. Where necessary, auxiliary layers, such as hole-conducting and electron-conducting layers are used. Metals, such as calcium, can be applied by vapor deposition as the cathode. The parts to be joined using the adhesive are the glass substrate, atop which is located the component, in this case the organic light-emitting diode, and a cover, preferably of glass. The adherends are positioned relative to one another in an inert atmosphere, i.e., an atmosphere which in particular is free from oxygen and water.

The adhesive can be applied by hand using a syringe or automatically using a dispenser and an xy table along the edges of the (glass) cover and penetrates into the adhesive joint by capillary forces. Depending on the viscosity of the adhesive, this takes place within a period ranging from seconds to minutes.

The exposure of the adhesive joint to UV light can be done using a lamp or a laser at a wavelength which corresponds to the absorption of the photoinitiator present in the adhesive. In the present case, irradiation is carried out using a mercury vapor lamp (output density in the UV A range: approx. 100 mW/cm$^2$; irradiation period: 20 s). A subsequent thermal treatment at 60° C. for a period of 20 minutes further improves the barrier effect with respect to water and oxygen.

Described below are adhesive formulations which are used with preference. The ingredients needed for the respective formulation can be stirred together in the stated amounts (amounts in parts by mass). Where present, the filler can be dispersed homogeneously using a dispersing disk.

| Reactive adhesive | Example | | |
|---|---|---|---|
| Components | (1) | (2) | (3) |
| Cycloaliphatic epoxide | 80 | 80 | 17.9 |
| Aliphatic epoxide | 30 | 30 | 4.4 |
| Hydroxy-functional reaction product | 80 | 80 | 11.9 |
| Silane adhesion promoter | 0.45 | 0.45 | 0.07 |
| Photoinitiator | 3 | 3 | 0.45 |
| Polyol | 97 | 97 | 21.4 |
| Surface-active compound | 0.3 | 0.3 | 0.05 |
| Very finely ground fused silica (filler) | — | 320 | — |
| Finely dispersed silica (filler) | — | — | 14.5 |

Specifically, the following components can be employed:

The cycloaliphatic epoxide used is a diepoxide, namely 3,4-epoxycyclohexylmethyl-3',4'-epoxycyclohexanecarboxylate (ECC); epoxide value: 0.74 mol/100 g.

The aliphatic epoxide is a commercial epoxidized soybean oil having an epoxide oxygen content of 6.3%.

The hydroxy-functional reaction product (of an epoxide and a phenol) is a reaction product of 100 parts by mass of ECC with 35 parts by mass of bisphenol A.

The silane adhesion promoter used is commercial glycidyloxypropyltrimethoxysilane.

The photoinitiator is a mixture of triarylsulfonium hexafluoroantimonates; a commercial solution in propylene carbonate with a strength of about 50% is used.

The polyol is a commercial polyestertriol; molar mass: 900, hydroxyl value: 0.33 mol/100 g.

The surface-active compound is a commercial surface-active siloxane.

The very finely ground fused silica is a commercial fine round-fused silica having an average particle size of 2.5 μm and a maximum particle size of 10 μm.

The finely dispersed silica is a commercial flame-hydrolyzed silica having a particle size in the submicrometer range.

In order to demonstrate the suitability and effectiveness of the method of an embodiment of the invention, the diodes capsuled in the manner described are subjected to the tests described below. These are defined test methods which are customary in microelectronics. Examples of possible assessment criteria include the luminance ($cd/m^2$), the efficiency (cd/A, lm/W), and the diode blocking ratio.

Storage of capsuled diodes under inert conditions with subsequent comparison of diode performance; for example, of the luminous intensity:

Diodes capsuled in the manner described are stored in argon both at room temperature and at 85° C. Even after prolonged periods—6 months for example—the diodes show no difference in luminous intensity. This indicates that, owing to its special formulation, the adhesive does not release any ingredients detrimental to diode performance. After the test, the capsuled diodes show no "dark spots" perceptible to the naked eye; these dark spots are areas which do not emit light. Degradation phenomena of this kind do occur, in contrast, in the case of unsuitable epoxy resins, owing to the outgassing of low molecular mass ingredients.

Temperature shock testing of capsuled diodes in air with subsequent comparison of diode performance; for example, the luminous intensity:

Diodes capsuled in the manner described are tested under the following conditions in air: 100, 200, and 500 cycles in the temperature range from −40° C. to +85° C. in 10 min, holding time 5 min in each case. Comparison of the luminous intensity of diodes subjected to the test before and after cycling shows no perceptible deterioration. This indicates that owing to the special formulation of the adhesive, sufficient imperviousness to water and oxygen is achieved. The excellent adhesion achievable with the special formulation and the thermal expansion matched to that of the glass ensure imperviousness even over a relatively wide temperature range. After the test, capsuled diodes show no changes that are perceptible to the naked eye. In the case of unsuitable epoxy resins, in contrast, degradation phenomena occur owing to the penetration of air and moisture.

Temperature/humidity cycle test of capsuled diodes in air with subsequent comparison of diode performance; for example, of the luminous intensity:

Diodes capsuled in the manner described are tested under the following conditions in air: 100, 200, and 500 cycles in the temperature range from 25° C. to 55° C. at a relative air humidity >94% (IEC 68-2-30). Comparison of the luminous intensity of diodes subjected to the test before and after cycling shows no perceptible deterioration. After the test, capsuled diodes show no degradation phenomena perceptible to the naked eye, such as occur in the case of inappropriate sealing.

Storage test of capsuled diodes at a temperature of 85° C. and a relative humidity of 85% with subsequent comparison of diode performance; for example, of the luminous intensity:

Diodes capsuled in the manner described are stored in air at 85° C. and a relative humidity of 85% for 100, 200, and 500 and 1000 h in each case. Comparison of the luminous intensity of diodes subjected to the test before and after testing shows no perceptible deterioration. After the test, capsuled diodes show no degradation phenomena perceptible to the naked eye, such as occur in the case of inappropriate sealing.

Storage of capsuled diodes at a constant temperature of 70° C. for a period of 1000 h with subsequent comparison of diode performance; for example, of the luminous intensity:

Diodes capsuled in the manner described are stored in air at 70° C. for 1000 h. Comparison of the luminous intensity of diodes subjected to the test before and after testing shows no perceptible deterioration. After the test, capsuled diodes show no degradation phenomena perceptible to the naked eye, such as occur in the case of inappropriate sealing.

Temperature shock test with simultaneous electrical loading of capsuled diodes in air with subsequent comparison of diode performance; for example, the luminous intensity:

Diodes capsuled in the manner described are tested under the following conditions in air: 100, 200, and 500 cycles in the temperature range from −40° C. to +85° C. in 10 min, holding time 5 min in each case. At the same time, the diodes are electrically loaded in an appropriate apparatus.

A voltage, in the range from 3 to 15 V for example, is applied to the diodes for 90 s. The voltage-free period is 270 s. Diode performance is recorded continuously throughout this time. Comparison of the luminous intensity of diodes subjected to the test before and after testing shows no perceptible deterioration. After the test, capsuled diodes show no degradation phenomena perceptible to the naked eye, such as occur in the case of inappropriate sealing.

Storage of capsuled diodes at a temperature of 80° C. and a relative air humidity of 80% for at least 240 h with subsequent comparison of diode performance; for example, of the luminous intensity:

Diodes capsuled in the manner described are stored in air at 80° C. and a relative humidity of 85% for at least 240 h. Comparison of the luminous intensity of diodes subjected to the test before and after testing shows no perceptible deterioration. After the test, capsuled diodes show no degradation phenomena perceptible to the naked eye, such as occur in the case of inappropriate sealing.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of encapsulating components based on organic semiconductors, comprising:

adhesively bonding a housing to a substrate, wherein the adhesive bonding is carried out using a UV-curable reactive adhesive including, an epoxy resin, a hydroxy-functional reaction product of an epoxide compound with a phenolic compound, a silane-type adhesion promoter, and a photoinitiator.

2. The method of claim 1, wherein the epoxy resin is to ≧70% by mass at least one of an aliphatic and a cycloaliphatic epoxide.

3. The method of claim 2, wherein the reactive adhesive contains from 3 to 80% by mass of hydroxy-functional reaction product.

4. The method of claim 2, wherein the reactive adhesive contains from 0.05 to 2% by mass of silane.

5. The method of claim 1, wherein the reactive adhesive contains from 3 to 80% by mass of hydroxy-functional reaction product.

6. The method of claim 1, wherein the reactive adhesive contains from 0.05 to 2% by mass of silane.

7. The method of claim 1, wherein the photoinitiator is an onium salt.

8. The method of claim 1, wherein the reactive adhesive further comprises a polyol.

9. The method of claim 1, wherein the reactive adhesive further comprises a surface-active compound.

10. The method of claim 9, wherein the surface active compound includes a surface-active siloxane.

11. The method of claim 1, wherein the component, after UV curing, is subjected to a thermal treatment.

12. The method of claim 11, wherein the thermal treatment is up to a temperature of 120° C.

13. The method of claim 1, wherein a cover is used as housing.

14. The method of claim 13, wherein the cover is glass.

15. The method of claim 1, wherein the components include organic light-emitting diodes.

16. The method of claim 1, wherein the UV-curable reactive adhesive includes a filler.

17. The method of claim 16, wherein the filler is at least one of a very finely ground, silica-based mineral and silica.

* * * * *